(12) United States Patent
Hong et al.

(10) Patent No.: US 8,804,400 B2
(45) Date of Patent: Aug. 12, 2014

(54) VARIABLE RESISTANCE MEMORY DEVICE AND METHOD OF FABRICATING THE SAME

(75) Inventors: Sanghyun Hong, Seoul (KR); Jaekyu Lee, Yongin-si (KR); Yong Kwan Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 111 days.

(21) Appl. No.: 13/469,740

(22) Filed: May 11, 2012

(65) Prior Publication Data

US 2012/0294065 A1   Nov. 22, 2012

(30) Foreign Application Priority Data

May 17, 2011   (KR) ........................ 10-2011-0046417

(51) Int. Cl.
*G11C 11/00* (2006.01)
*H01L 47/00* (2006.01)

(52) U.S. Cl.
USPC .................... 365/148; 365/163; 257/3; 257/4

(58) Field of Classification Search
USPC ........................................ 365/148
See application file for complete search history.

(56) References Cited

U.S. PATENT DOCUMENTS

| 7,777,214 | B2 | 8/2010 | Shin et al. | |
| 7,811,879 | B2 * | 10/2010 | Lam et al. | 257/5 |
| 7,989,251 | B2 * | 8/2011 | Nejad | 438/57 |
| 8,203,135 | B2 * | 6/2012 | Sim et al. | 257/4 |
| 2007/0267669 | A1 | 11/2007 | Kim et al. | |
| 2009/0189141 | A1 | 7/2009 | Shin et al. | |
| 2009/0321705 | A1 | 12/2009 | Lee et al. | |
| 2011/0155989 | A1 * | 6/2011 | Park et al. | 257/3 |
| 2012/0145985 | A1 * | 6/2012 | Lee | 257/4 |
| 2013/0153852 | A1 * | 6/2013 | Park et al. | 257/4 |

FOREIGN PATENT DOCUMENTS

| KR | 10-0722769 B1 | 5/2007 |
| KR | 2009-0081848 A | 7/2009 |
| KR | 2010-0002654 A | 1/2010 |

\* cited by examiner

*Primary Examiner* — Son Mai
(74) *Attorney, Agent, or Firm* — Harness, Dickey & Pierce, P.L.C.

(57) ABSTRACT

According to an example embodiment, a variable resistance memory device includes a lower electrode that includes a spacer-shaped first sub lower electrode and a second sub lower electrode covering a curved sidewall of the first sub lower electrode. The second sub lower electrode extends upward to protrude above the top of the first sub lower electrode. The lower electrode includes an upward-tapered shape.

17 Claims, 24 Drawing Sheets

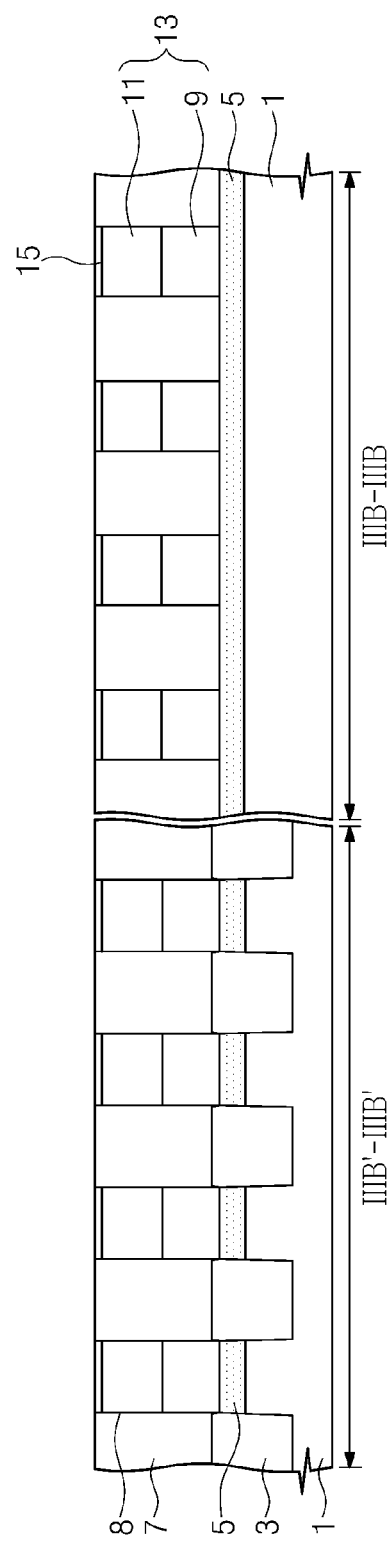

VARIABLE RESISTANCE MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2011-0046417, filed on May 17, 2011, in the Korean Intellectual Property Office, the entire contents of which are hereby incorporated by reference.

BACKGROUND

Some example embodiments of inventive concepts relate to variable resistance memory devices and/or methods of fabricating the same.

Next generation semiconductor memory devices are being developed for high performance and low power usage. Next generation semiconductor memory devices may, for instance, include a ferroelectric random access memory (FRAM), a magnetic random access memory (MRAM) and a phase change random access memory (PRAM). Materials constituting the next generation semiconductor memory devices may exhibit varying resistance depending on a current or voltage applied thereto, and be able to maintain a resistance even when a current supply or a voltage supply is interrupted.

PRAM devices using phase changeable material are being studied because PRAM devices may have satisfactory operation speed and integration.

SUMMARY

Some example embodiments of inventive concepts relate to variable resistance memory devices with improved reliability.

Other example embodiments of inventive concepts relate to methods of fabricating a variable resistance memory device with improved reliability.

According to an example embodiment of inventive concepts, a variable resistance memory device may include a word line, a bit line crossing over the word line, a selection device between the word line and the bit line, a lower electrode between the selection device and the bit line, and a variable resistance pattern between the lower electrode and the bit line. The lower electrode may include a first sub lower electrode having an upward-tapered spacer in shape and a second sub lower electrode covering a sidewall of the first sub lower electrode and protruding above a top of the first sub lower electrode.

An upper portion and a lower portion of the second sub lower electrode may have the substantially equal widths.

The device may further include a first ohmic layer between the selection device and the lower electrode.

The device may further include an etch stop conductive pattern between the first ohmic layer and the lower electrode.

The first sub lower electrode may expose at least part of the etch stop conductive pattern.

A material of the first sub lower electrode may provide an ohmic contact between the first ohmic layer and the second sub lower electrode.

The device may further include a second ohmic layer between the first sub lower electrode and the first ohmic layer.

The second ohmic layer may have an L shape, and the second ohmic layer may conform to at least one sidewall of the first sub lower electrode.

The variable resistance pattern may be spaced apart from the first sub lower electrode and the variable resistance pattern may contact the second sub lower electrode.

According to example embodiments of inventive concepts, a method of fabricating a variable resistance memory device may include forming a word line, forming an interlayer dielectric over the word line where the interlayer dielectric defines a hole exposing the word line, forming a switching device in the hole of the interlayer dielectric, the switching device being electrically connected to the word line, forming an insulating pattern on the interlayer dielectric, the insulating pattern defining a first groove that partially exposes the switching device, forming a first sub lower electrode in the first groove and on the switching device, the first sub lower electrode having an upward-tapered spacer in shape, forming a second sub lower electrode to cover a sidewall of the first sub lower electrode, forming a variable resistance pattern on the second sub lower electrode, and forming a bit line on the variable resistance pattern.

The forming of the second sub lower electrode may include conformally forming a second sub lower electrode layer to cover the sidewall of the first sub lower electrode and an upper sidewall and a top surface of the insulating pattern, etching the second sub lower electrode layer to expose the top surfaces of the insulating pattern and a top surface of the interlayer dielectric, the etching the second sub electrode forming a spacer-shaped second sub lower electrode covering the sidewall of the first sub lower electrode and the upper sidewall of the insulating pattern, and partially removing an upper portion of the insulating pattern and the spacer-shaped second sub lower electrode. An upper portion and a lower portion of the second sub lower electrode may have substantially equal widths.

The forming of the first sub lower electrode may include conformally forming a first sub lower electrode layer on the insulating pattern and in the first grooves of the insulating pattern, anisotropically etching the first sub lower electrode layer to form a spacer-shaped first sub lower electrode on a sidewall of the insulating pattern, and isotropically and selectively etching the spacer-shaped first sub lower electrode to expose an upper sidewall of the insulating pattern.

According to example embodiments, a variable resistance memory device includes at least one memory cell connected to a bit line and a word line. The at least one memory cell includes a selection element, a variable resistance element, and a lower electrode having a first sub electrode and a second sub electrode between the selection element and the variable resistance element. The first sub electrode has one curved surface. The second sub electrode has a curved portion that covers the curved surface of the first sub electrode, and the second sub electrode has a protruding portion between the first sub electrode and one of the variable resistance element and the selection element.

The first sub electrode may include a first flat surface that is non-parallel to a second flat surface of the first sub electrode. The first flat surface may face an upper surface of the selection device, and a width of the first flat surface may be less than a width of the upper surface of the selection device.

The protruding portion of the second sub electrode may include an upper surface that contacts a lower surface of the variable resistance element, and a width of the protruding portion may be less than a width of the variable resistance element.

The first sub electrode may have an upward-tapered spacer shape.

The at least one memory cell may include a first ohmic layer between the selection element and the variable resistance element, and a bottom surface of the curved portion of the second sub electrode may contact the first ohmic layer.

The at least one memory cell may include a second ohmic layer having a L-shape. The first sub electrode may be between the second ohmic layer and the curved portion of the second sub electrode, and the protruding portion of the second sub electrode is over the second ohmic layer.

The variable resistance memory device of claim 13 may include a plurality of the word lines and a plurality of the bit lines, and a matrix including a plurality of the memory cells arranged in rows and columns. Each row of the matrix may include at least two of the memory cells electrically connected to one word line and different bit lines. Each column of the matrix may include at least two of the memory cells electrically connected to different word lines and one bit line.

According to example embodiments, a memory system may include a memory controller connected to at least one of the foregoing memory devices.

BRIEF DESCRIPTION OF THE DRAWINGS

Example embodiments will be more clearly understood from the following brief description taken in conjunction with the accompanying drawings. The accompanying drawings represent some non-limiting example embodiments. The drawings are not necessarily to scale, emphasis instead being placed upon illustrating the principles of inventive concepts. In the drawings:

FIGS. 3B, 4B, 11B, and 12B are plan views taken along lines IIIB-IIIB and IIIB'-IIIB' of FIG. 3A, IVB-IVB and IVB'-IVB' of FIG. 4A, XIB-XIB and XIB'-XIB' of FIG. 11A, and XIIB-XIIB and XIIB'-XIIB' of FIG. 12A, respectively;

DETAILED DESCRIPTION

Figure 1:
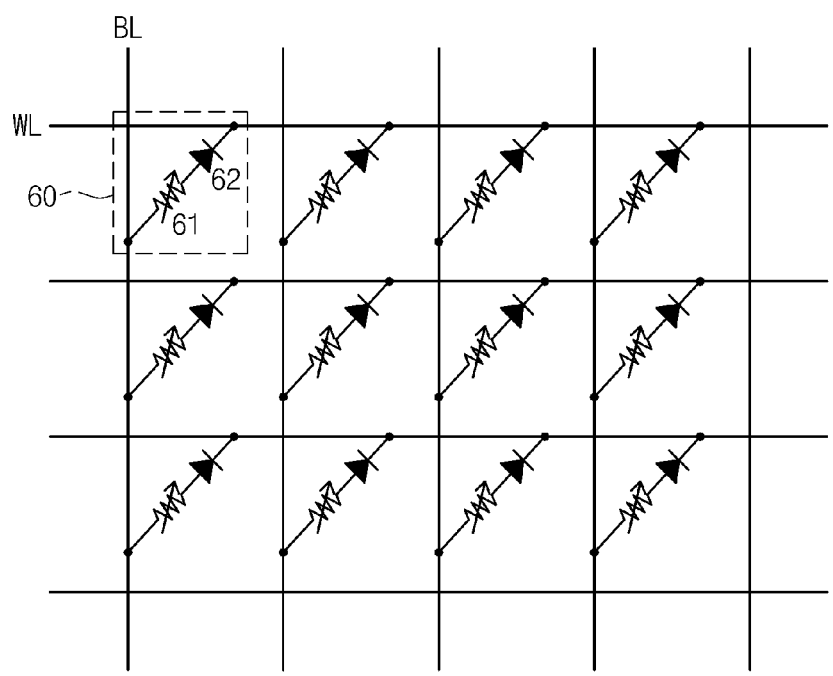
FIG. 1 is a circuit diagram of a memory cell array of a variable resistance memory device according to an example embodiment of inventive concepts.

Example embodiments of inventive concepts will now be described more fully with reference to the accompanying drawings, in which some example embodiments are shown.

Example embodiments of inventive concepts may, however, be embodied in many different forms and should not be construed as being limited to the embodiments set forth herein; rather, these embodiments are provided so that this disclosure will be thorough and complete, and will fully convey scope of example embodiments of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram of a memory cell array of a variable resistance memory device according to an example embodiment of inventive concepts.

Referring to FIG. 1, a variable resistance memory device 100 may include a plurality of memory cells 60 arranged in a matrix form. Each of the memory cells 60 may include a variable resistance device 61 and a selection device 62. The variable resistance device 61 may be disposed between a bit line BL and the selection device 62 to connect them to each other, and the selection device 62 may be between the variable resistance device 61 and a word line WL to connect them each other.

The variable resistance device 61 may include at least one material having a variable resistance property, such as, phase changeable materials, ferroelectric materials, or magnetic materials. In some example embodiments, the variable resistance device 61 may have a resistance that depends on an amount of electric current supplied to the variable resistance device 61 from the bit line BL.

The selection device 62 may be interposed between the variable resistance device 61 and the word line WL. The selection device 62 may be configured to control an electric current flow between the word line WL and the variable resistance device 61. For instance, the selection device 62 may be switched into one of an on-state and an off-state, depending on a voltage of the word line WL. In some example embodiments, as shown in FIG. 1, the selection device 62 may be a diode, but example embodiments of inventive concepts are not limited thereto. For instance, the selection device 62 may be one of a MOS transistor and a bipolar transistor.

In order to reduce complexity in the description and to provide better understanding of inventive concepts, some example embodiments, in which a phase changeable material is used as a material the variable resistance device 61, will be described hereinafter. But, example embodiments of inventive concepts are not limited thereto. For instance, the variable resistance device 61 may be one of a resistance random access memory (RRAM), a ferroelectric RAM (FRAM) and a magnetic RAM (MRAM)

The phase changeable material for the variable resistance device 61 may have a resistance that depends on temperature. For instance, the phase changeable material may be in an amorphous state with relatively high resistance and a crystalline state with relatively low resistance, depending on temperature and cooling time. In the variable resistance device 61, the phase changeable material may be heated by a Joule heating mechanism, and temperature thereof may be controlled by adjusting an amount of electric current supplied through a lower electrode. In some example embodiments, to control the temperature of the phase changeable material, the variable resistance device 61 may be configured to control at least one of an amount of electric current and a supplying time of electric current.

Embodiment 1

Figure 2A:
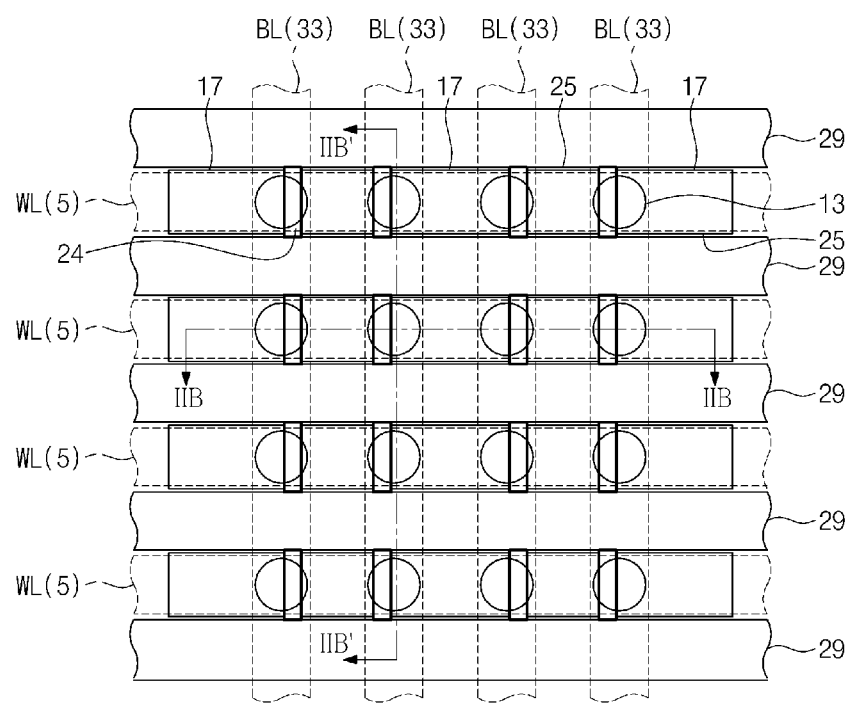
FIG. 2A is a layout diagram of a variable resistance memory device according to an example embodiment of inventive concepts.
Figure 2B:
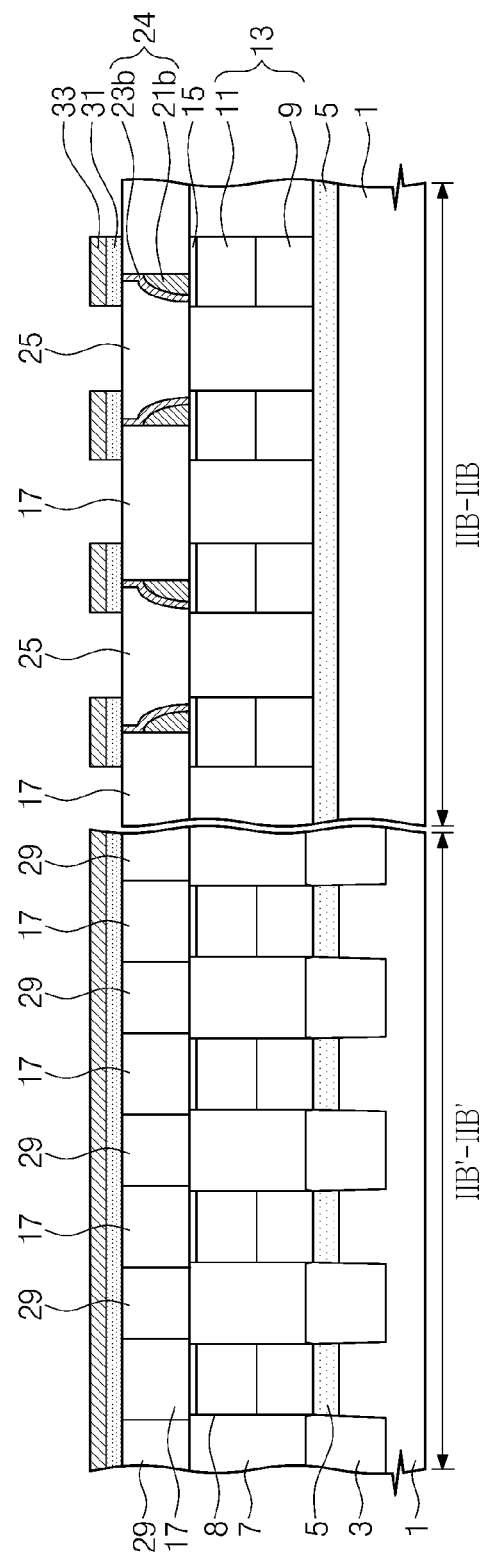
FIG. 2B is a sectional view taken along lines IIB-IIB and IIB'-IIB' of FIG. 2A.

FIG. 2A is a layout diagram of a variable resistance memory device according to some example embodiments of inventive concepts. FIG. 2B is a sectional view taken along lines IIB-IIB and IIB'-IIB' of FIG. 2A.

Referring to FIGS. 2A and 2B, a variable resistance memory device may include a plurality of parallel word lines 5 disposed on a substrate 1. A device isolation layer 3 may be disposed in the substrate 1 to define an active region. In some example embodiments, the word lines 5 may be impurity doped regions formed in the substrate 1. In other example embodiments, the word lines 5 may be conductive patterns disposed on the substrate 1. A plurality of parallel bit lines 33 may be disposed on the word lines 5 to cross the word lines 5. On the substrate 1, there may be an interlayer dielectric 7 interposed between the bit lines 33 and the word lines 5. The interlayer dielectric 7 may be formed to define selection device holes 8 positioned at intersections of the bit lines 33 and the word lines 5. A selection device 13 may be disposed in the selection device hole 8. In some example embodiments, the selection device 13 may include a diode. For instance, the selection device 13 may include a first semiconductor pattern 9 and a second semiconductor pattern 11 that are doped with impurities of different types. In the selection device hole 8, there may be an ohmic layer 15 disposed on the selection device 13. The ohmic layer 15 may be formed of, for example, metal silicide.

A first insulating layer 17 may be disposed on the interlayer dielectric 7 to be in partial contact with both of two adjacent ohmic layers 15. For instance, each of the ohmic layers 15 may have two regions that are respectively covered and uncovered with the first insulating layer 17. A lower electrode 24 may be disposed on a sidewall of the first insulating layer 17 to be in contact with the ohmic layer 15 disposed thereunder. The lower electrode 24 may include a first sub lower electrode 21b and a second sub lower electrode 23b. The first sub lower electrode 21b may be formed to have a spacer shape to cover a lower sidewall of the first insulating layer 17. Here, the spacer shape may refer to an upward tapered shape with vertical and curved sidewalls. The second sub lower electrode 23b may be formed to cover a sidewall of the first sub lower electrode 21b and an upper sidewall of the first insulating layer 17. The second sub lower electrode 23b may have the same (or substantially the same) deposition thickness throughout; that is, the second sub lower electrode 23b may conformally cover the first sub lower electrode 21b. A second insulating layer 25 may be interposed between two adjacent second sub lower electrodes 23b to fill a gap region formed therebetween. On the interlayer dielectric 7, there may be a third insulating layer 29 disposed on the adjacent word lines 5. A variable resistance pattern 31 may be disposed between the second sub lower electrode 23b and the bit line 33. The variable resistance pattern 31 may be formed of a compound containing at least two elements selected from a group of Te, Se, Ge, Sb, Bi, Pb, Sn, Ag, As, S, Si, P, O, and C. The variable resistance pattern 31 may be spaced apart from the first sub lower electrode 21b and be in contact with the second sub lower electrode 23b. In other words, a top surface of the second sub lower electrode 23b may correspond to a top surface of the lower electrode 24 that is in contact with the variable resistance pattern 31. This enables a reduced contact area between the variable resistance pattern 31 and the top surface of the lower electrode 24 and thus, to reduce an electric current required for a program operation. The first and second sub lower electrodes 21b and 23b may include at least one of Ti, $TiSi_x$, TiN, TiON, TiW, TiAlN, TiAlON, TiSiN, TiBN, W, $WSi_x$, WN, WON, WSiN, WBN, WCN, Ta, $TaSi_x$, TaN, TaON, TaAlN, TaSiN, TaCN, Mo, MoN, MoSiN, MoAlN, NbN, ZrSiN, ZrAlN, Ru, CoSi, NiSi, Cu, a conductive carbon group, or any combination thereof. In some example embodiments, the second sub lower electrode 23b may be formed of TiSiN, TaN, or TiC, and the first sub lower electrode 21b may be formed of a material (for example, titanium and/or titanium nitride) capable of realizing an ohmic contact between the ohmic layer 15 and the second sub lower electrode 23b.

In below, a method of fabricating the variable resistance memory according to an example embodiment is described.

FIGS. 3A, 4A, 11A, and 12A are plan views illustrating a method of fabricating the variable resistance memory device of FIG. 2A. FIGS. 3B, 4B, 11B, and 12B are plan views taken along lines IIIB-IIIB and IIIB'-IIIB' of FIG. 3A, IVB-IVB and IVB'-IVB' of FIG. 4A, XIB-XIB and XIB'-XIB' of FIG. 11A, and XIIB-XIIB and XIIB'-XIIB' of FIG. 12A, respectively. FIGS. 5A, 6A, 7, 8, 9, 10 and 13 are sectional views illustrating a method of fabricating the variable resistance memory device of FIG. 2B. FIGS. 5B and 6B are sectional views illustrating a method of fabricating a variable resistance memory device according to some example embodiments of inventive concepts.

Figure 3A:
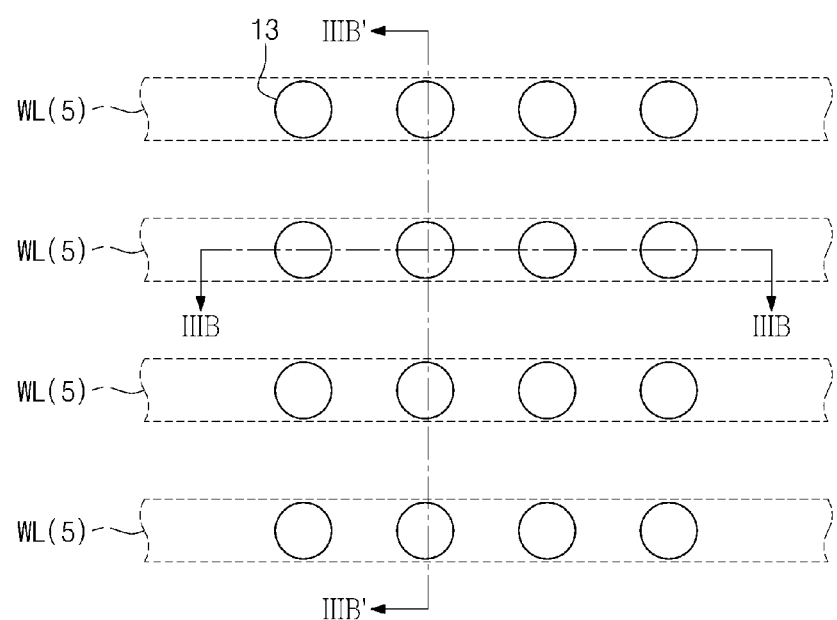
FIGS. 3A, 4A, 11A, and 12A are plan views that illustrate a method of fabricating the variable resistance memory device of FIG. 2A.

Referring to FIGS. 3A and 3B, a device isolation layer 3 defining an active region may be formed in a substrate 1. The substrate 1 may be a semiconductor substrate structure. The semiconductor substrate structure may be, for example, a silicon substrate, a silicon-on-insulator (SOI) substrate, a silicon germanium (SiGe) substrate, a germanium (Ge) substrate, a gallium arsenic (GaAs) substrate, or a substrate including a doped or undoped semiconductor layer and an epitaxial layer on the semiconductor layer. In some example embodiments, the substrate 1 may be a p-type silicon substrate. The device isolation layer 3 may be shaped like a plurality of lines. The device isolation layer 3 may be formed using a shallow trench isolation (STI) process, but example embodiments are not limited thereto.

A plurality of word lines 5 may be formed by doping the active region with impurities. In some example embodiments, the word lines 5 may be spaced apart from each other in parallel. The word lines 5 may be formed by doping the active region with impurities of n-type. In other example embodiments, the word lines 5 may be formed by various other methods. For example, the formation of the word lines 5 may include forming a plurality of epitaxial semiconductor layers horizontally parallel to each other on the substrate 1 and then implanting impurity ions into the epitaxial semiconductor layers. Alternatively, during the formation of the epitaxial semiconductor layers, the impurities may be doped into the epitaxial semiconductor layers in an in-situ manner. In other example embodiments, the word lines 5 may be formed of a conductive layer. An interlayer dielectric 7 may be formed on the substrate 1 provided with the word lines 5. The formation of the interlayer dielectric may include, for example, depositing a silicon oxide layer on the substrate 1. The interlayer dielectric 7 may be patterned to form a plurality of selection device holes 8 exposing the word lines 5.

Selection devices 13 may be formed in the selection device holes 8, respectively. In some example embodiments, the selection device 13 may be a diode. The formation of the selection device 13 may include sequentially forming an n-type semiconductor layer 9 and a p-type semiconductor layer 11. For instance, the formation of the selection device 13 may include forming a semiconductor layer of germanium, silicon, or silicon germanium in the selection device hole 8 and then implanting impurities into the semiconductor layer. The semiconductor layer may be formed using one of selective epitaxial growth (SEG) or solid epitaxial growth (SPE) processes. The word line 5 exposed by the selection device hole 8 may be used as a seed layer during the SEG process. In the SPE process, the formation of the word line 5 may include forming an amorphous or polycrystalline silicon layer in the selection device hole 8 and then crystallizing the silicon layer.

In the selection device holes 8, an ohmic layer 15 may be formed to be in contact with the selection device 13. The ohmic layer 13 may reduce a contact resistance between the selection device 13 and a lower electrode to be subsequently formed. In some example embodiments, the ohmic layer 13 may be formed of a metal silicide layer, such as cobalt silicide, nickel silicide or titanium silicide, but example embodiments are not limited thereto.

Figure 4A:
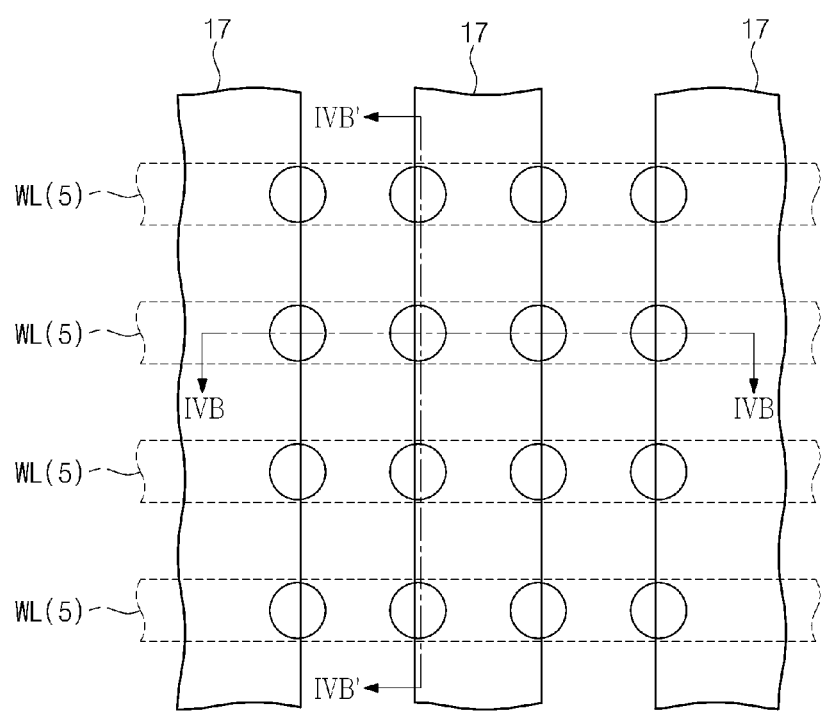
Figure 4B:
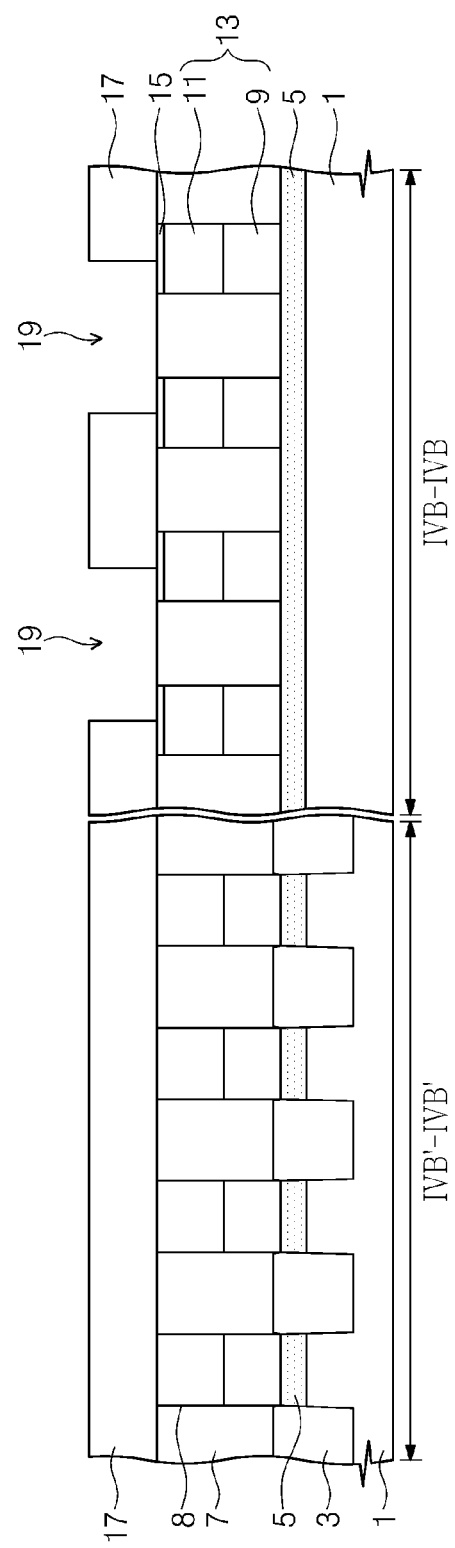

Referring to FIGS. 4A and 4B, a first insulating layer 17 may be formed on the interlayer dielectric 7. The formation of the first insulating layer 17 may include depositing an insulating layer on the interlayer dielectric 7 and patterning the insulating layer. The first insulating layer 17 may be formed of an oxide layer, a nitride layer, or an oxynitride layer. The first insulating layer 17 may include a first groove 19 partially exposing top surfaces of two adjacent ohmic layers along a direction. In some example embodiments, the first insulating layer 17 may be shaped like a line crossing the word lines 5.

Figure 5A:
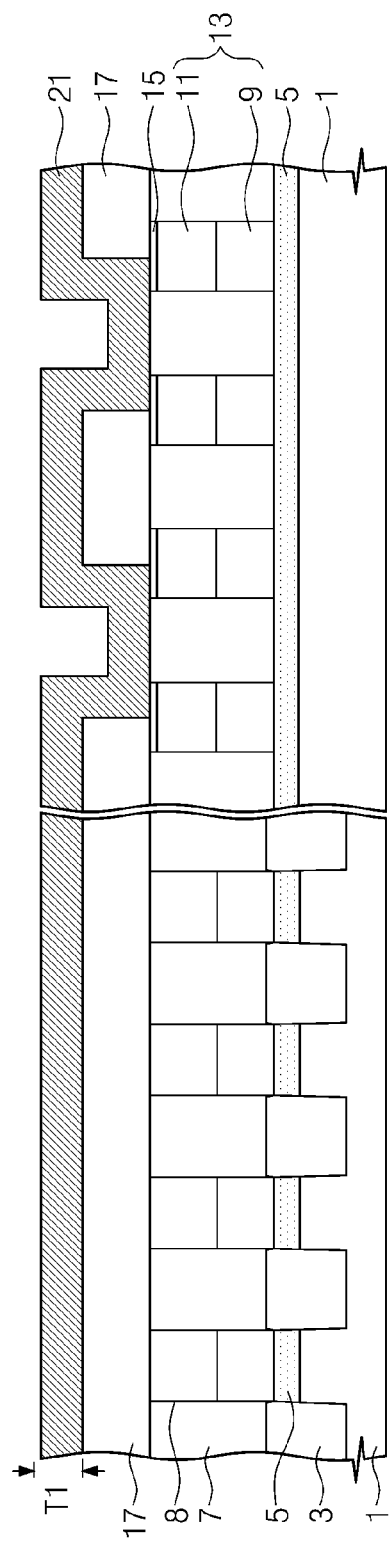
FIGS. 5A, 6A, 7, 8, 9, 10 and 13 are sectional views illustrating a method of fabricating the variable resistance memory device of FIG. 2B.
Figure 5B:
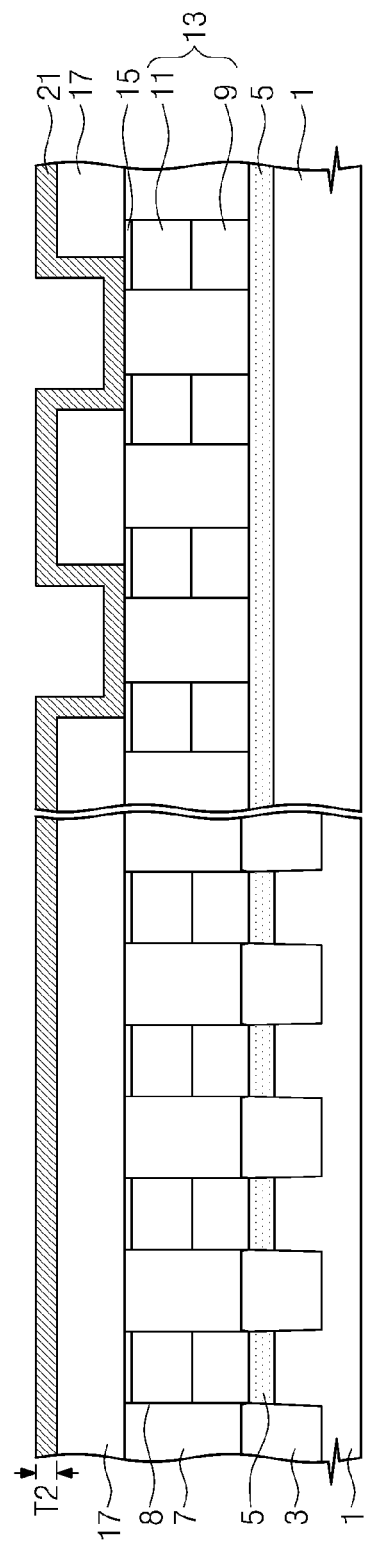
FIGS. 5B and 6B are sectional views illustrating a method of fabricating a variable resistance memory device according to an example embodiment of inventive concepts.

Referring to FIG. 5A, a first sub lower electrode layer 21 may be conformally formed on the substrate 1 provided with the first insulating layer 17. In some example embodiments, the first sub lower electrode layer 21 may be formed to a first thickness T1. The first sub lower electrode layer 21 may be formed of a material capable of realizing an ohmic contact between the ohmic layer 15, which may be formed of a metal silicide layer, and a second sub lower electrode, which will be subsequently formed. For instance, the first sub lower electrode layer 21 may be formed of at least one of a titanium layer and a titanium nitride layer, formed by a physical or chemical vapor deposition process.

Figure 6A:
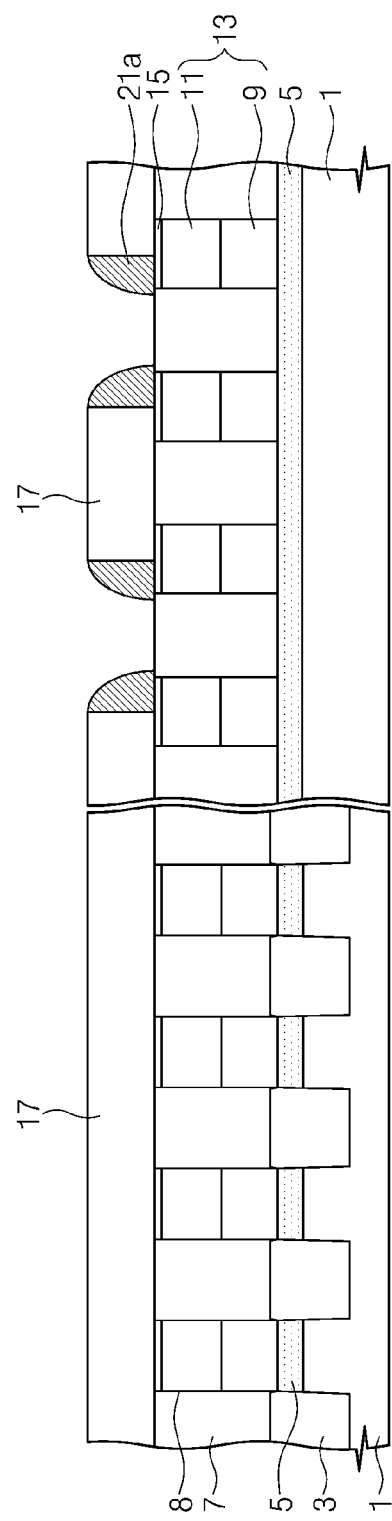
Figure 6B:
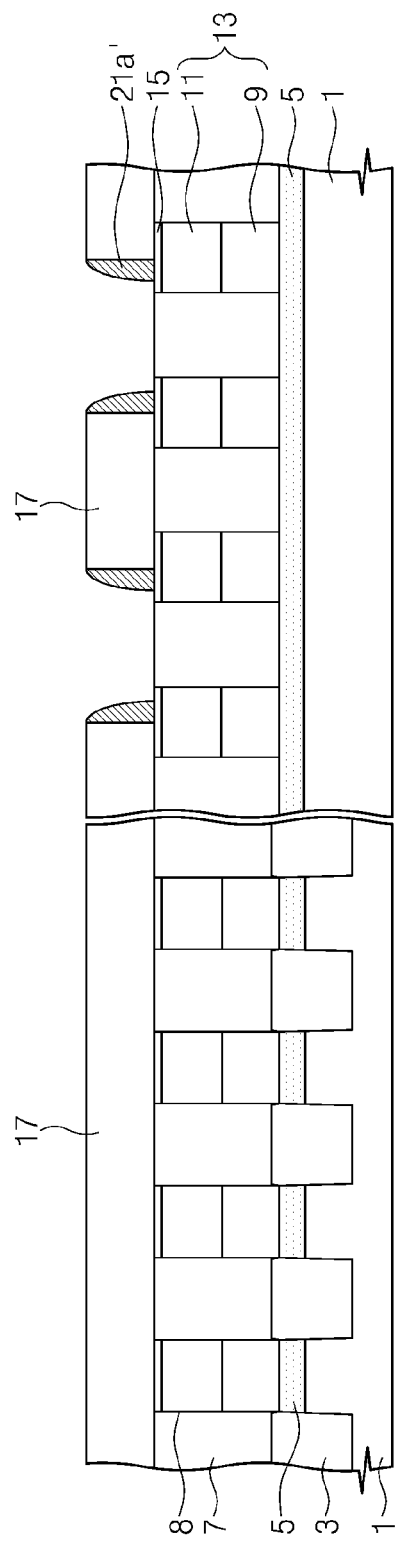

Referring to FIG. 6A, the first sub lower electrode layer 21 may be etched to form a preliminary first sub lower electrode 21a exposing top surfaces of the interlayer dielectric 7 and the first insulating layer 17 and covering the whole sidewall of the first insulating layer 17. The formation of the preliminary first sub lower electrode 21a may be performed using an anisotropic etching process. The preliminary first sub lower electrode 21a may be formed to have the spacer shape.

Figure 7:
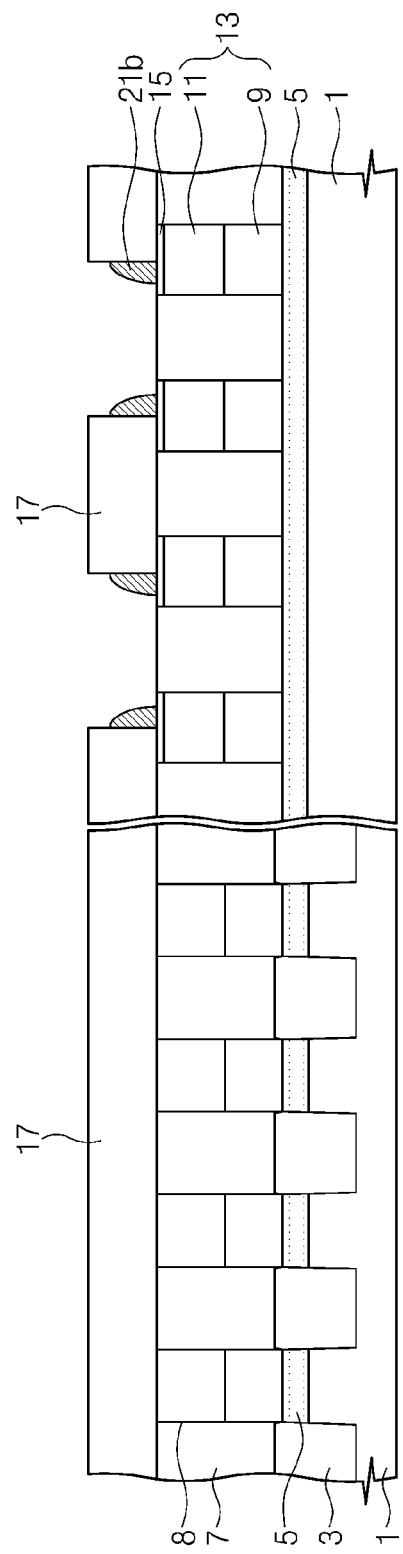

Referring to FIG. 7, the preliminary first sub lower electrode 21a may be etched to form a first sub lower electrode 21b partially exposing an upper sidewall of the first insulating layer 17. The first sub lower electrode 21b may be formed using an isotropic etching process that is performed to partially remove an exposed sidewall of the preliminary first sub lower electrode 21a. As a result, the first sub lower electrode 21b may have a reduced width, compared with the preliminary first sub lower electrode 21a. Due to the isotropic etch process removing a portion of the preliminary first sub lower electrode 21a, it is possible to effectively reduce an etch damage on a top surface of the interlayer dielectric 7, compared with the case that this process is performed using an anisotropic etch process.

In other example embodiments, the first sub lower electrode 21b may be formed using a method described with reference to FIGS. 5B, 6B and 7.

Referring to FIG. 5B, a first sub lower electrode layer 21 may be conformally formed on the substrate 1 provided with the first insulating layer 17. In some example embodiments, the first sub lower electrode layer 21 may be formed to a second thickness T2. The second thickness T2 may be smaller than the first thickness T1 of FIG. 5A. Referring to FIG. 6B, the first sub lower electrode layer 21 may be etched to form a preliminary first sub lower electrode 21a' exposing top surfaces of the interlayer dielectric 7 and the first insulating layer 17 and covering the whole sidewall of the first insulating layer 17. The formation of the preliminary first sub lower electrode 21a' may be performed using an anisotropic etching process. The preliminary first sub lower electrode 21a' may be formed to have the spacer shape. Referring to FIG. 7, the preliminary first sub lower electrode 21a may be etched to form a first sub lower electrode 21b partially exposing an upper sidewall of the first insulating layer 17. The first sub lower electrode 21b may be formed using an additional isotropic etching process.

Figure 8:
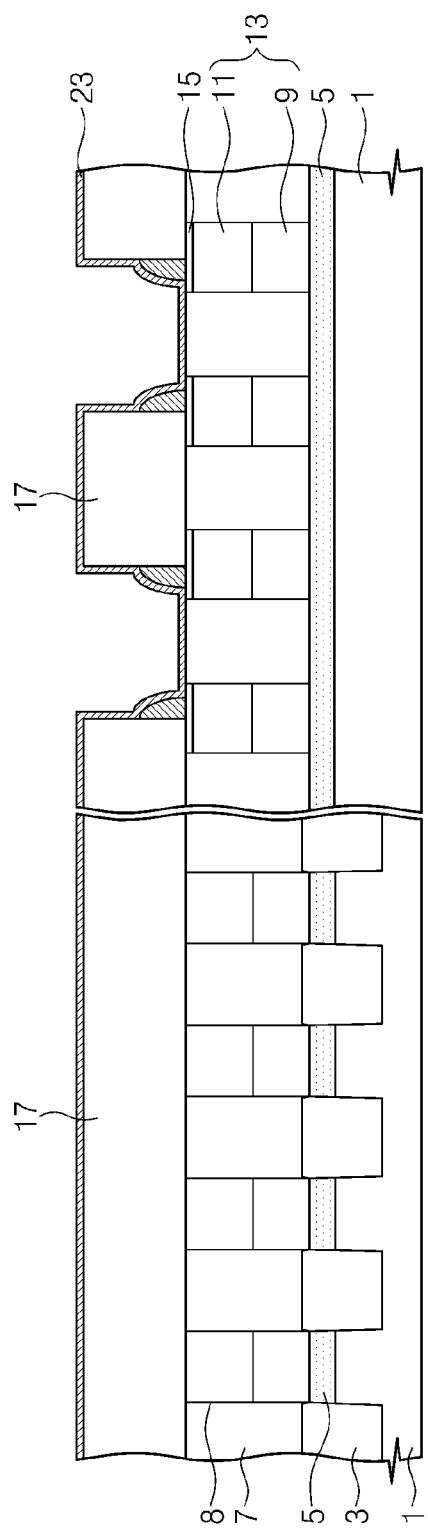

Referring to FIG. 8, a second sub lower electrode layer 23 may be conformally formed on the substrate 1 provided with the first sub lower electrode 21b. As used herein, conformality is a layer property describing how well the topography of the underlying surface is replicated. For example, a conformal layer has substantially the same shape as the surface it covers and/or has substantially the same thickness throughout. The second sub lower electrode layer 23 may be formed to cover the top surface and the upper sidewall of the first insulating layer 17, an exposed sidewall of the first sub lower electrode 21b, and the top surface of the interlayer dielectric 7.

Figure 9:
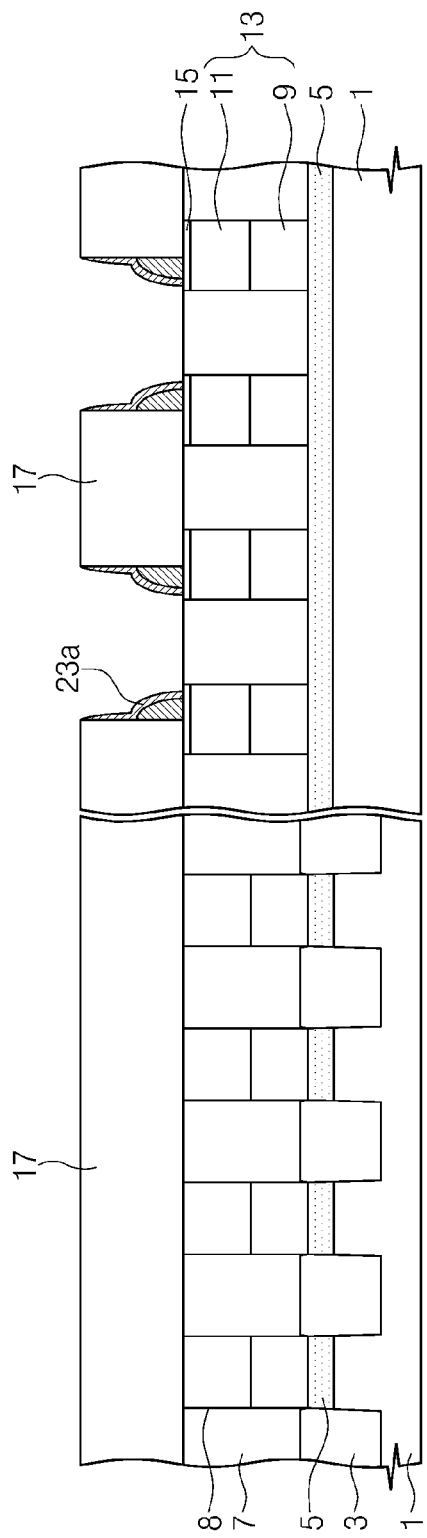

Referring to FIG. 9, the second sub lower electrode layer 23 may be etched to form a preliminary second sub lower electrode 23a and expose the top surfaces of the first insulating layer 17 and the interlayer dielectric 7. The preliminary second sub lower electrode 23a may be formed to cover the sidewall of the first sub lower electrode 21b and the upper sidewall of the first insulating layer 17. In some example embodiments, the formation of preliminary second sub lower electrode 23a may be performed using an anisotropic etch technique.

Figure 10:
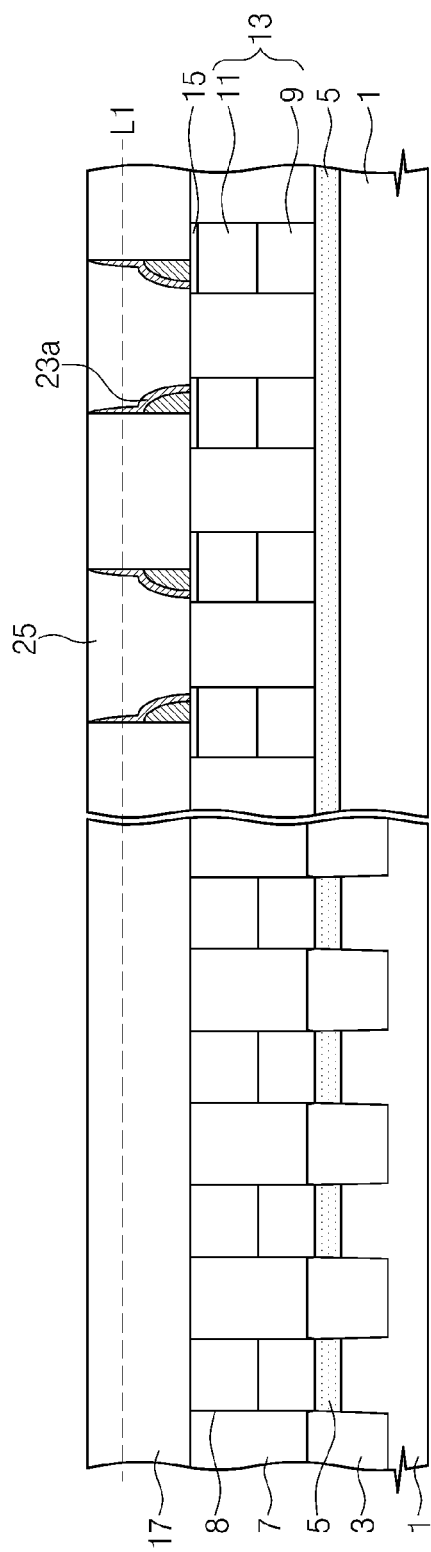

Referring to FIG. 10, a second insulating layer 25 may be formed to fill a space between the two adjacent preliminary second sub lower electrodes 23a. In some example embodiments, the second insulating layer 25 may serve as a protection layer for a subsequent planarization process, such as a chemical mechanical polishing process. For instance, the second insulating layer 25 may reduce (and/or prevent) an exposed sidewall of the preliminary second sub lower electrodes 23a from being damaged during the subsequent planarization process. In some example embodiments, the second insulating layer 25 may be formed of a material having the same (or substantially the same) etch rate as the first insulating layer 17.

Figure 11A:
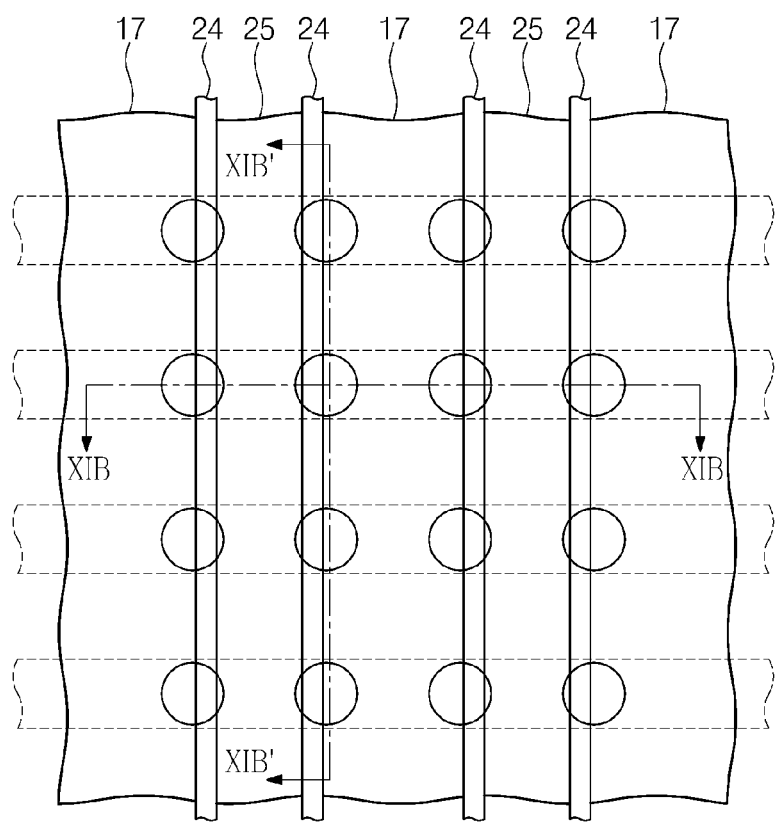
Figure 11B:
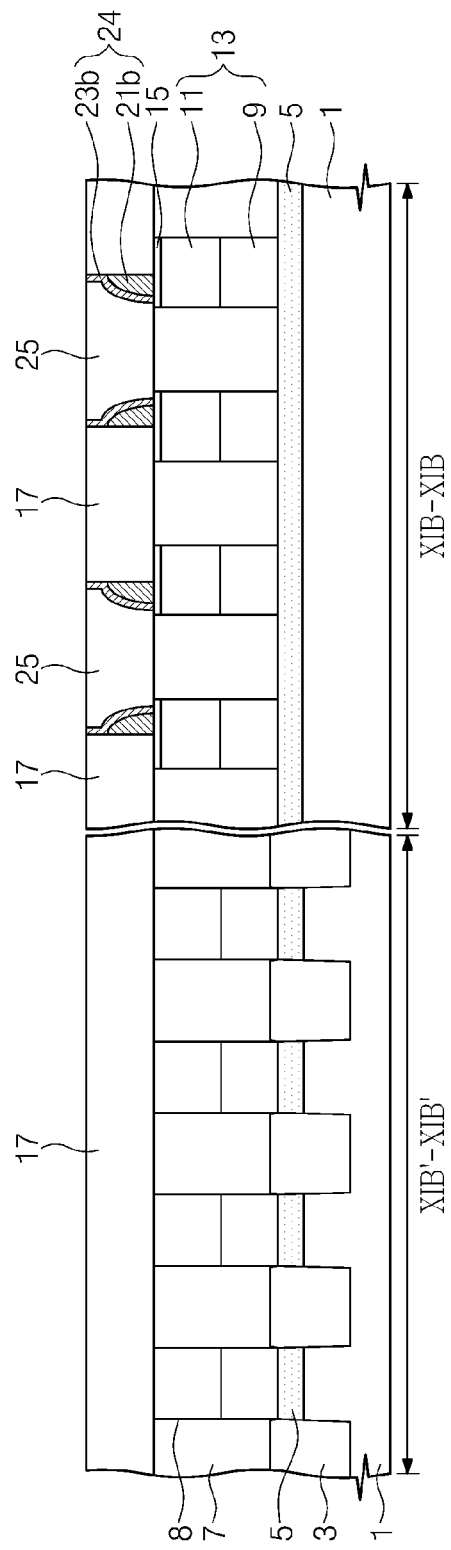

Referring to FIGS. 10, 11A and 11B, after the formation of the second insulating layer 25, the planarization process, such as a chemical mechanical polishing process or an etch back process, may be performed to form a second sub lower electrode 23b. The planarization process may be performed to remove upper portions of the preliminary second sub lower electrodes 23a and upper portions of the first and second insulating layers 17 and 25, for instance, positioned above a dotted line L1 in FIG. 10. A planarization depth depicted by the dotted line L1 may be selected in such a way that the upper sharp portions of the preliminary second sub lower electrodes 23a are removed. In some example embodiments, after the planarization, the second sub lower electrode 23b may have a uniform (or about uniform) horizontal width. The second sub lower electrode 23b and the first sub lower electrode 21b may form a lower electrode 24. Lower and upper portions of the second sub lower electrode 23b may have the substantially same width, which may be equivalent to a deposition thickness of the second sub lower electrode layer 23. Accordingly, an area of a top surface of the second sub lower electrode 23b may be adjusted by controlling the deposition thickness of the second sub lower electrode layer 23. In addition, in the case that the top surface of the second sub lower electrode 23b is exposed by a planarization process, it is possible to reduce an inter-cell variation in the top surface area of the lower electrode 24 and moreover to reduce statistical dispersion of the reset electric current. This enables to realize a variable resistance memory device with an improved reliability. Furthermore, in the case that the first and second sub lower electrodes 21b and 23b are formed using a spacer-forming process, they can be formed in a simplified manner without misalignment therebetween.

Figure 12A:
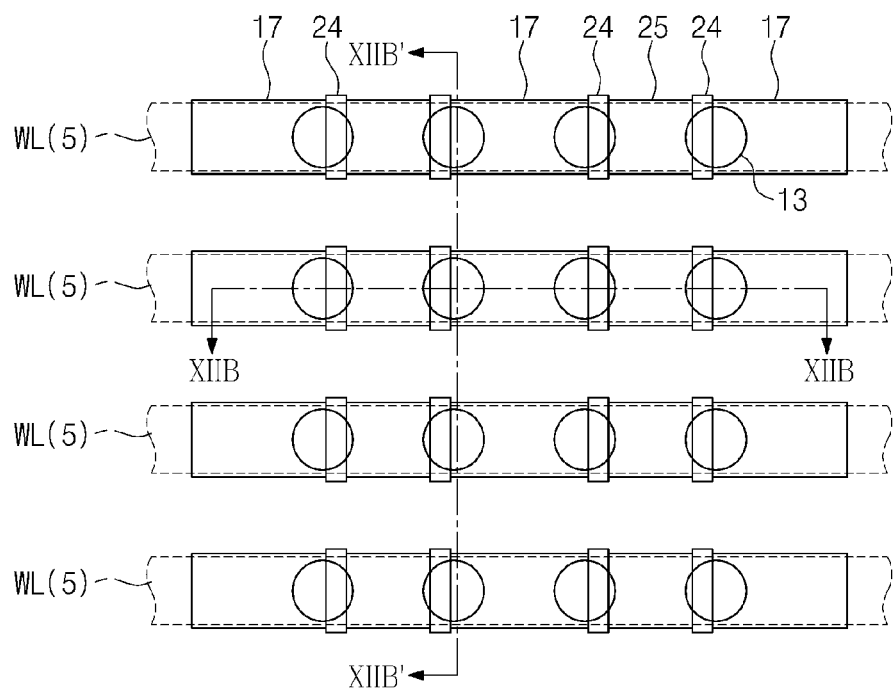
Figure 12B:
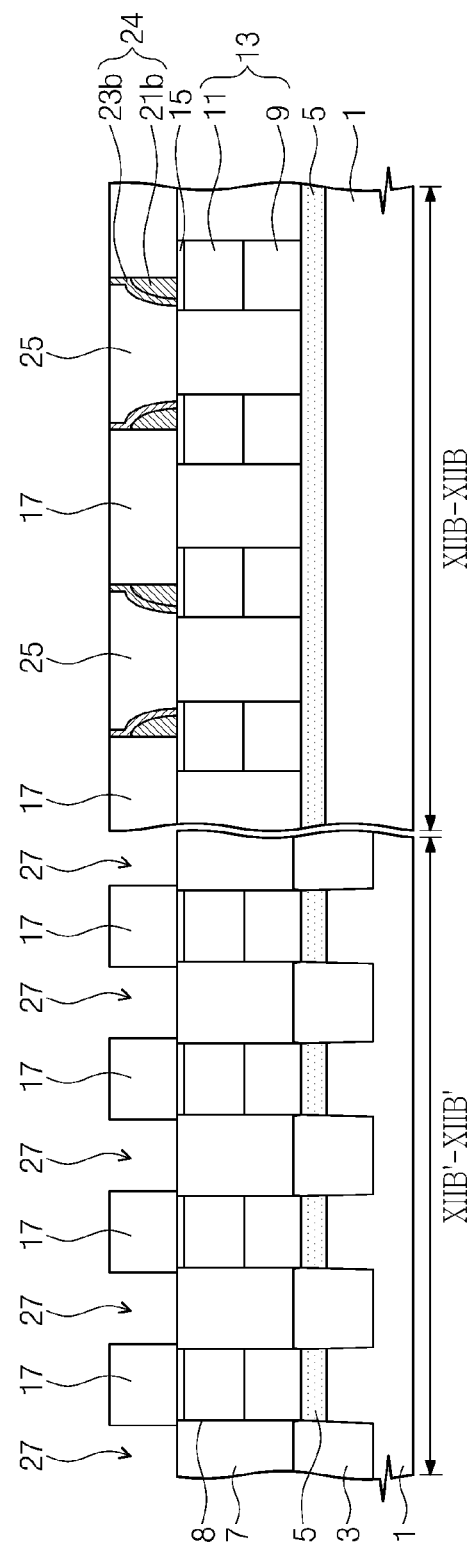

Referring to FIGS. 12A and 12B, second grooves 27 may be formed to expose the top surface of the interlayer dielectric 7. The second groove 27 may be formed by removing the lower electrode 24 and the first and second insulating layers 17 and 25 disposed between adjacent ones of the word lines 5. In some example embodiments, due to the removal process, each of the selection devices 13 may be overlapped with the corresponding one of the lower electrodes 24, in plan view. The lower electrodes 24 may be spaced apart from each other.

Figure 13:
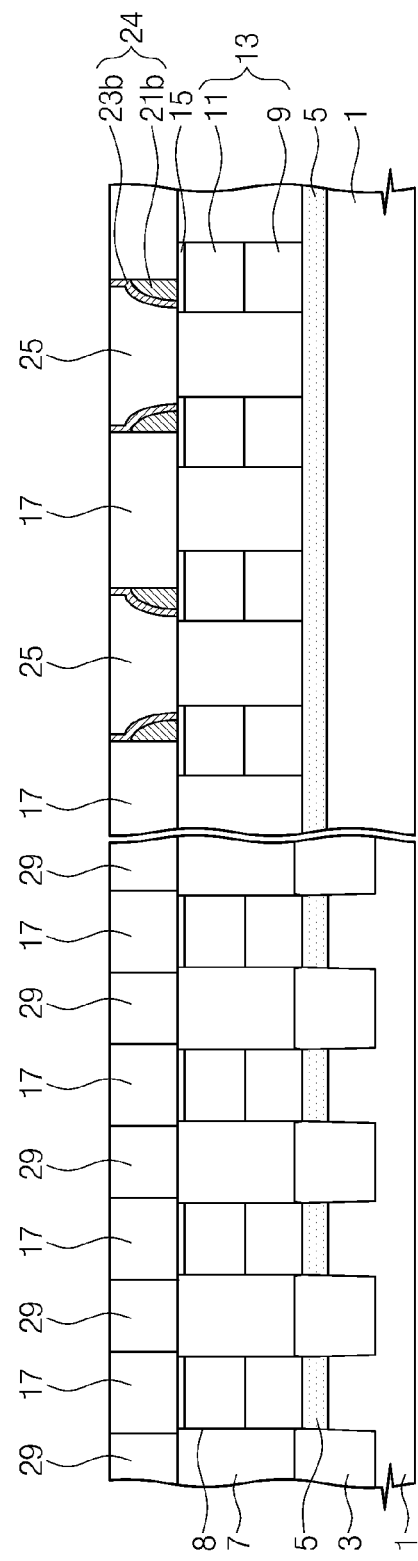

Referring to FIG. 13, a third insulating layer 29 may be formed to fill the second groove 27.

Subsequently, as shown in FIGS. 2A and 2B, bit lines 33 and variable resistance patterns 31 may be formed to cross the word line 5. The formation of the bit lines 33 and the variable resistance patterns 31 may include depositing a variable resistance layer and a conductive layer on the substrate 1 and patterning them.

Embodiment 2

Figure 14:
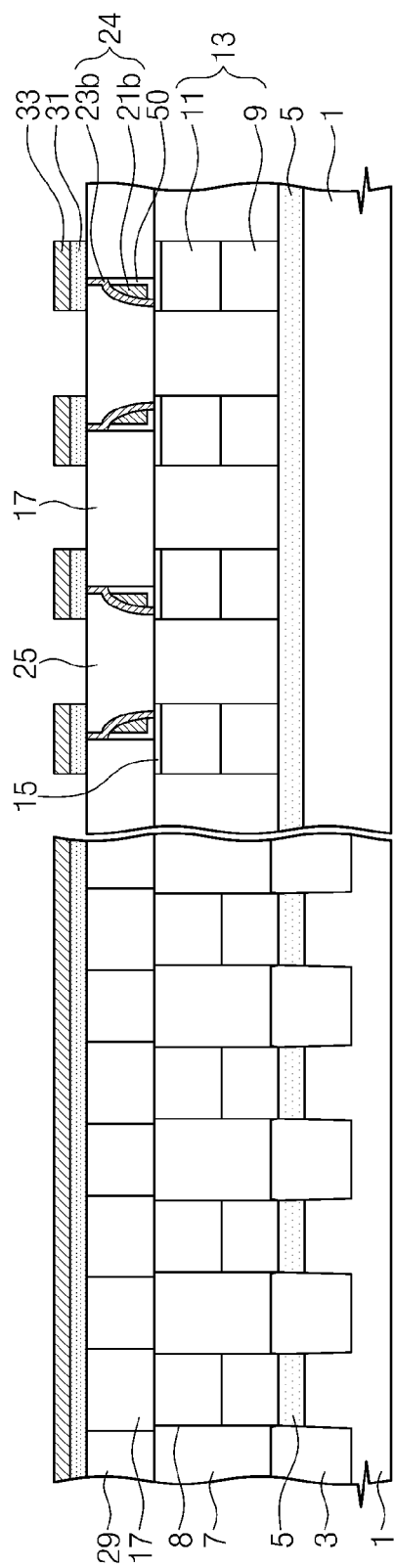
FIG. 14 is a sectional view of a variable resistance memory device according to an example embodiment of inventive concepts.

FIG. 14 is a sectional view of a variable resistance memory device according to other example embodiments of inventive concepts.

Referring to FIG. 14, a variable resistance memory device according to other example embodiments of inventive concepts may include a second ohmic layer 50 interposed between the first sub lower electrode 21b and the ohmic layer 15. The second ohmic layer 50 may extend vertically to have an L-shape. In other words, the second ohmic layer 50 may further include a portion interposed between the first sub lower electrode 21b and the first insulating layer 17. The second ohmic layer 50 may be formed of a material (for example, at least one of titanium and titanium nitride) enabling to reduce a contact resistance between the first sub lower electrode 21b and the ohmic layer 15.

The formation of the variable resistance memory device with the second ohmic layer 50 may include conformally forming the second ohmic layer 50 and then etching the second ohmic layer 50. The formation of the second ohmic layer 50 may be performed before the formation of the first sub lower electrode layer 21 described with reference to FIG.

5A or FIG. 5B. The etching of the second ohmic layer 50 may be performed using an etch recipe modified from that of the etching step described with reference to FIG. 6A or FIG. 6B and FIG. 7, for instance, configured to etch the first sub lower electrode layer 21 and the second ohmic layer 50 in the substantially same etch rate. Except for these differences, the variable resistance memory device according to embodiment 2 may be configured or fabricated to have the same technical feature as that of the embodiment 1.

Embodiment 3

Figure 15:
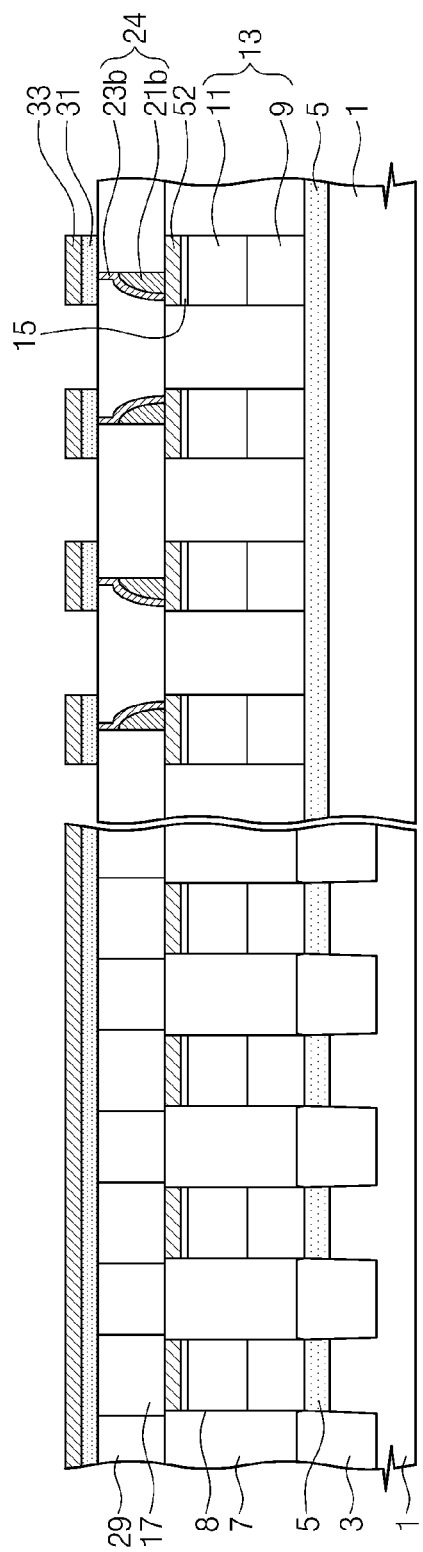
FIG. 15 is a sectional view of a variable resistance memory device according to an example embodiment of inventive concepts.

FIG. 15 is a sectional view of a variable resistance memory device according to another example embodiment of inventive concepts.

Referring to FIG. 15, a variable resistance memory device according to another example embodiment of inventive concepts may include an etch stop conductive pattern 52 disposed in the selection device hole 8 to be in contact with the ohmic layer 15. The lower electrode 24 may be in partial contact with the etch stop conductive pattern 52 to expose a portion of the etch stop conductive pattern 52. The etch stop conductive pattern 52 may be formed of, for example, tungsten. The etch stop conductive pattern 52 may reduce (or prevent) the ohmic layer 15 from being damaged during the anisotropic etching process for the formation of the first and second sub lower electrodes 21b and 23b.

The etch stop conductive patterns 52 may be formed on the ohmic layer 15 in the selection device hole 8 during the steps described with reference to FIGS. 3A and 3B.

Except for these differences, the variable resistance memory device according embodiment 3 may be configured or fabricated to have the same or similar technical features as that of the embodiment 1.

Figure 16:
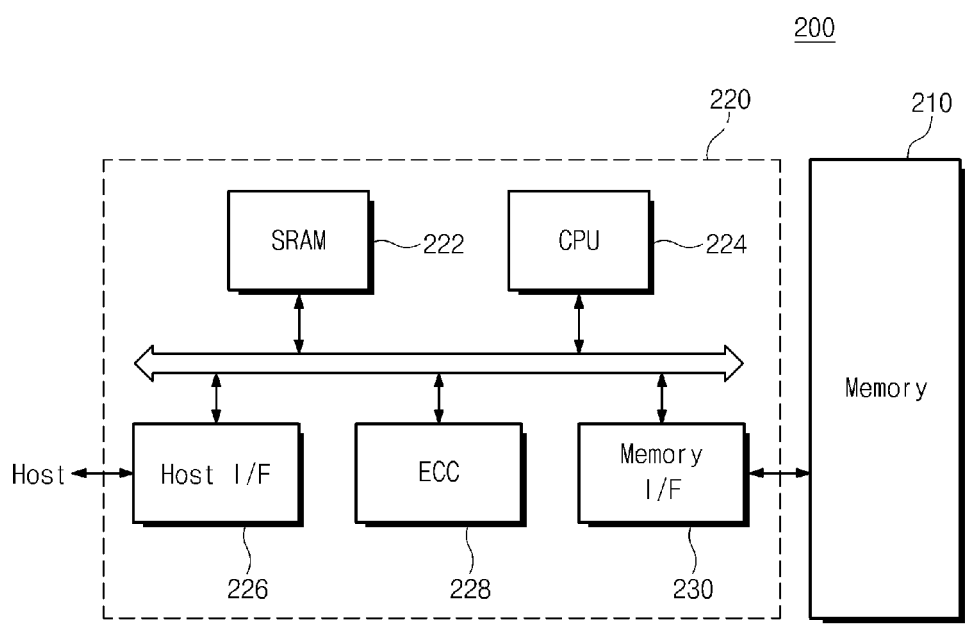
FIG. 16 is a block diagram of a system including a memory device according to an example embodiment of inventive concepts.

FIG. 16 is a block diagram illustrating a system including a memory device according to an example embodiment of inventive concepts.

Referring to FIG. 16, the system may be a memory card 200 including at least one of the variable resistance memory devices according to example embodiments of the inventive concepts. For instance, the memory card 200 may include a memory controller 220 controlling general data exchanges between a host and a memory device 210. A static random access memory (SRAM) 222 may be used as an operating memory of a processing unit 224. A host interface 226 may include a data exchange protocol of a host connected to the memory card 200. An error correction code 228 may detect and correct errors included in data read from the memory device 210. A memory interface 230 may interface with the memory device 210. A processing unit 224 may perform general control operations for data exchange of the memory controller 220.

The memory device 210 may be one of the variable resistance memory devices according to example embodiments of the inventive concepts. Accordingly, the memory device 210 may include an ohmic pattern and a first electrode pattern aligned with each other in a self-alignment manner, and the fabricating method thereof can be simplified. In addition, the memory device 210 may include a selection device having a height smaller than that of a conventional selection device. Accordingly, the memory device 210 can be easily fabricated.

Figure 17:
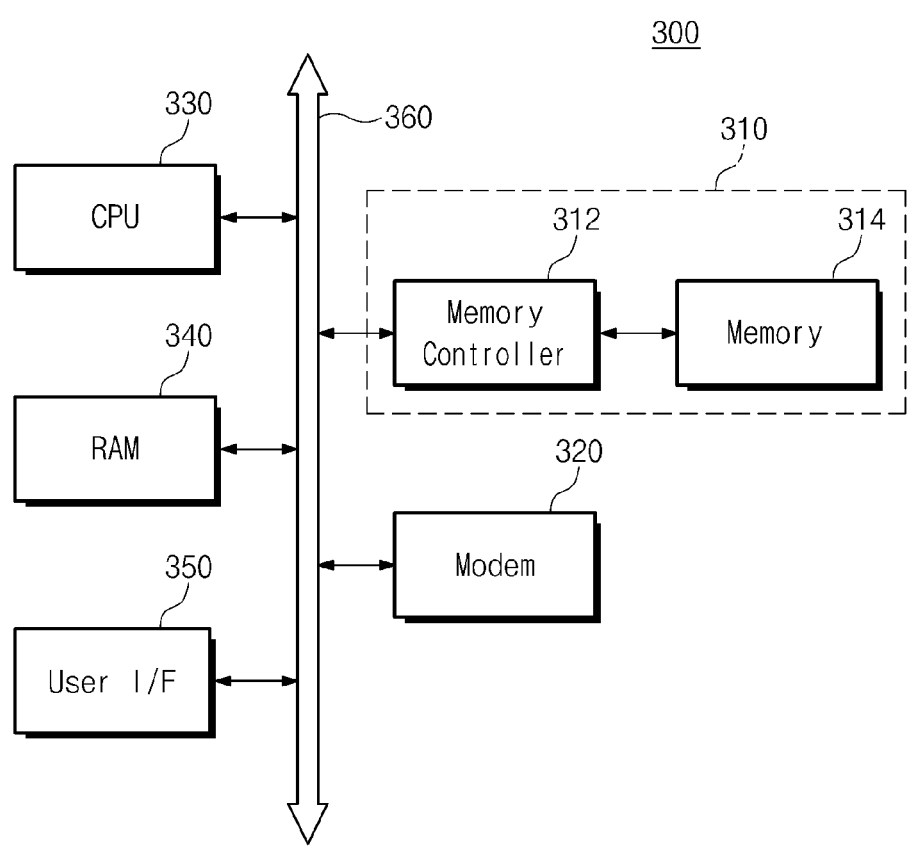
FIG. 17 is a block diagram of a memory card including a memory device according to an example embodiment of inventive concepts.

FIG. 17 is a block diagram illustrating an information processing system including a memory device according to example embodiments of the inventive concepts.

Referring to FIG. 17, the information processing system 300 may be realized using a memory system 310 including at least one of the variable resistance memory devices according to example embodiments of the inventive concepts. For instance, the information processing system 300 may be a mobile device and/or a desktop computer. In some example embodiments, the information processing system 300 may further include a modem 320, a central processing unit (CPU) 330, a RAM 340, and a user interface 350, which are electrically connected to a system bus 360, in addition to the memory system 310. Data processed by the CPU 330 and/or input from the outside may be stored in the memory system 310. The memory system 310 may include a memory device 312 and a memory controller 314, and in some example embodiments, the memory system 310 may be configured substantially identical to the system described with respect to FIG. 16. Although not illustrated, it is apparent to those skilled in the art that, for example, a memory card, a solid state drive (SSD), an application chipset, a camera image sensor, a camera image signal processor (ISP), an input/output device, or the like may further be included in the information processing system 300 according to the inventive concepts. In some example embodiments, the memory system 310 may be used as a portion of the solid state drive (SSD), and in this case, the information processing system 300 may stably and reliably store a large amount of data in the memory system 310.

According to example embodiments of inventive concepts, a variable resistance memory device may include a lower electrode having a spacer-shaped first sub lower electrode and a second sub lower electrode covering a curved sidewall of the first sub lower electrode. The second sub lower electrode may extend upward to protrude above the top of the first sub lower electrode. In other words, the lower electrode may have an upward-tapered shape, and this enables to reduce an electric current required for a program operation.

Furthermore, a top area of the lower electrode can be determined by a thickness of the second sub lower electrode, which may be easily adjusted. In addition, in the case that a top surface of the second sub lower electrode is exposed by a planarization process, it is possible to reduce an inter-cell variation in the top area of the lower electrode and moreover to reduce statistical dispersion of the reset electric current. This enables to realize a variable resistance memory device with an improved reliability.

In the case that the first and second sub lower electrodes are formed using a spacer-forming process, they can be formed in a simplified manner with reduced misalignment therebetween.

While some example embodiments of inventive concepts have been particularly shown and described, it will be understood by one of ordinary skill in the art that variations in form and detail may be made therein without departing from the spirit and scope of the claims.

What is claimed is:
1. A variable resistance memory device, comprising:
a word line;
a bit line crossing over the word line;
a selection device between the word line and the bit line,
a lower electrode between the selection device and the bit line, the lower electrode including,
a first sub lower electrode having an upward-tapered spacer shape, and
a second sub lower electrode covering a sidewall of the first sub lower electrode and protruding above a top of the first sub lower electrode, and
a variable resistance pattern between the lower electrode and the bit line.

2. The device of claim 1, wherein
an upper portion and a lower portion of the second sub lower electrode have substantially equal widths.

3. The device of claim 1, further comprising:
a first ohmic layer between the selection device and the lower electrode.

4. The device of claim 3, further comprising:
an etch stop conductive pattern between the first ohmic layer and the lower electrode.

5. The device of claim 4, wherein
the first sub lower electrode exposes at least part of the etch stop conductive pattern.

6. The device of claim 3, wherein
a material of the first sub lower electrode provides an ohmic contact between the first ohmic layer and the second sub lower electrode.

7. The device of claim 3, further comprising:
a second ohmic layer between the first sub lower electrode and the first ohmic layer.

8. The device of claim 7, wherein
the second ohmic layer has an L shape, and
the second ohmic layer conforms to at least one sidewall of the first sub lower electrode.

9. The device of claim 1, wherein
the variable resistance pattern is spaced apart from the first sub lower electrode, and
the variable resistance patterns contacts the second sub lower electrode.

10. A variable resistance memory device comprising:
at least one memory cell connected to a bit line and a word line, the at least one memory cell including,
  a selection element,
  a variable resistance element, and
  a lower electrode having a first sub electrode and a second sub electrode between the selection element and the variable resistance element,
    the first sub electrode having one curved surface,
    the second sub electrode having a curved portion covering the curved surface of the first sub electrode, and
    the second sub electrode having a protruding portion between the first sub electrode and one of the variable resistance element and the selection element.

11. The variable resistance memory device of claim 10, wherein
the first sub electrode includes a first flat surface that is non-parallel to a second flat surface of the first sub electrode,
the first flat surface faces an upper surface of the selection device, and
a width of the first flat surface is less than a width of the upper surface of the selection device.

12. The variable resistance memory device of claim 10, wherein
the protruding portion of the second sub electrode includes an upper surface that contacts a lower surface of the variable resistance element, and
a width of the protruding portion is less than a width of the variable resistance element.

13. The variable resistance memory device of claim 10, wherein
the first sub electrode has an upward-tapered spacer shape.

14. The variable resistance memory device of claim 10, wherein
the at least one memory cell includes a first ohmic layer between the selection element and the variable resistance element, and
a bottom surface of the curved portion of the second sub electrode contacts the first ohmic layer.

15. The variable resistance memory device of claim 14, wherein
the at least one memory cell includes a second ohmic layer having a L-shape,
the first sub electrode is between the second ohmic layer and the curved portion of the second sub electrode, and
the protruding portion of the second sub electrode is over the second ohmic layer.

16. The variable resistance memory device of claim 10, further comprising:
a plurality of the word lines;
a plurality of the bit lines;
a matrix including a plurality of the memory cells arranged in rows and columns, wherein
each row of the matrix includes at least two of the memory cells electrically connected to one word line and different bit lines, and
each column of the matrix includes at least two of the memory cells electrically connected to different word lines and one bit line.

17. A memory system comprising:
a memory controller connected to at least one memory device according to claim 10.

* * * * *